(12) United States Patent
Arnold et al.

(10) Patent No.: US 6,512,706 B1
(45) Date of Patent: Jan. 28, 2003

(54) SYSTEM AND METHOD FOR WRITING TO A REGISTER FILE

(75) Inventors: Ronny Lee Arnold, Ft Collins, CO (US); Gary J Benjamin, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/493,336

(22) Filed: Jan. 28, 2000

(51) Int. Cl.$^7$ .................................................. G11C 7/00
(52) U.S. Cl. ............................ 365/189.12; 365/189.05; 365/240
(58) Field of Search ....................... 365/189.12, 189.05, 365/240, 189.01, 230.05, 230.08

(56) References Cited

U.S. PATENT DOCUMENTS

| 5,815,444 A | * | 9/1998 | Ohta ...................... 365/189.05 |
| 5,859,999 A | | 1/1999 | Morris et al. ................ 395/565 |
| 5,860,017 A | | 1/1999 | Sharangpani et al. .. 395/800.23 |

OTHER PUBLICATIONS

Alexander Wolfe, "Patents Shed Light on Merced: Techniques of Predication and Speculation Detailed," Electronic Engineering Times, Feb. 15, 1999, pp. 43–44.

Patterson, et al., "Computer Architechture: A Quantitative Approach," Morgan Kaufmann Publishers, Inc., 2ed, 1990, pp. 150–154 and 191–193.

Gary Lauterbach, "Sun's Next–Generation High–End SPARC Microprocessor," Microprocessor Forum, Oct. 14–15, 1997, pp. 3–6.

* cited by examiner

*Primary Examiner*—David Lam

(57) ABSTRACT

The present invention generally provides a system and method for writing data to a register file. In architecture, the system of the present invention utilizes a plurality of registers and a write port coupled to each of the registers. The write port receives a register identifier identifying one of the registers and receives a first signal, such as a bit of predicate data, a set signal, or a reset signal. The write port transmits the first signal and a decode signal to each of the registers. The write port is configured to assert the decode signal transmitted to the one register identified by the register identifier and to deassert the decode signal transmitted to the other registers. Each of the registers includes a set/reset latch and is configured to receive the first signal and the decode signal transmitted to it from the write port.

20 Claims, 9 Drawing Sheets

SYSTEM AND METHOD FOR WRITING TO A REGISTER FILE

BACKGROUND OF THE INVENTION

1. Field of the Invention

The present invention generally relates to data processing techniques and, in particular, to a system and method for writing data to a register included within a register file. The present invention is particularly advantageous in applications that maintain a single bit of data in each register of the register file.

2. Related Art

Predication techniques have been developed to increase the performance of many instruction processing systems. In this regard, it is well known that each instruction of a computer program is not necessarily executed during each run of the computer program. For example, certain portions of the computer program may execute only if certain run time conditions are true. However, it is generally more efficient for an instruction processing system to begin processing instructions before it is known whether or not the instructions should execute, and predication techniques enable such processing to occur.

In this regard, predicate data is maintained within a processing system. The predicate data indicates whether or not the instructions being processed by the processing system should be executed based on the most recent information available. The predicate data is updated as the instructions are processed by the pipelines of the processing system. If the predicate data indicates that an instruction should not be executed, then the instruction passes without execution through the pipelines. If the predicate data indicates that the instruction should be executed, then the instruction is executed by one of the pipelines. Since processing of the instructions by the pipelines is commenced prior to determinations of whether or not the instructions should execute, the instructions, as a whole, are usually processed by the pipelines quicker.

The predicate data is typically maintained in a predicate register file. The predicate register file usually includes a plurality of predicate registers, in which one bit of information is stored in each register. Each instruction of a computer program is associated with one of the predicate registers in the predicate register file, and more than one instruction may be associated with the same predicate register. In this regard, each instruction usually includes a register identifier that identifies the predicate register associated with the instruction. While the instruction is being processed by one of the pipelines of the processing system, the bit of information in the predicate register associated with the instruction indicates, based on presently available information, whether or not the instruction should be executed.

The predicate data is produced by some of the instructions being processed by the pipelines of the processing system. As different instructions are processed, one instruction may cause the predicate value contained in one of the predicate registers to be asserted while another instruction may, at a different time, cause the same predicate value to be deasserted.

When asserted, the predicate value contained in a predicate register indicates hat the instructions associated with the predicate register are presently predicate nabled (i.e., that the instructions should be executed by the pipelines processing the instructions). When deasserted, the predicate value contained in a predicate register indicates that the instructions associated with the predicate register are presently predicate disabled (i.e., that the instructions should pass through the pipelines without executing).

While an instruction is being processed by one of the pipelines of the processing system, the bit value in the predicate register associated with the instruction is analyzed. If the bit value is asserted, then the instruction is enabled, and the instruction is, therefore, executed. If the bit value is deasserted, then the instruction is disabled, and the instruction, therefore, passes through the pipeline without executing.

The predicate data stored in the predicate register file can also be used to resolve data hazards. For example, if a data hazard exists between two instructions, then one of the instructions is usually stalled (i.e., temporarily prevented from further processing) until the data hazard is resolved or expired. By analyzing the predicate data in the predicate register file, it is possible to detect that one of the instructions is predicate disabled and, therefore, will not execute. As a result, the stall on the one instruction can either be prevented or removed without risking a data error. Therefore, by analyzing the predicate data in the predicate register file, it is sometimes possible to resolve data hazards and to prevent or reduce stalls.

Needless to say, it is important for the predicate register file to be quickly updated once new predicate data is produced so that the predicate register file contains the most recent predicate data available. Unfortunately, there is a finite amount of delay required to write to and read from the predicate register file. Thus, a heretofore unaddressed need exists in the industry for minimizing the amount of time required to update the predicate register file with newly produced predicate data.

SUMMARY OF THE INVENTION

The present invention overcomes the inadequacies and deficiencies of the prior art as discussed hereinbefore. Generally, the present invention provides a system and method for writing data to a register file.

In architecture, the system of the present invention utilizes a plurality of registers and at least one write port coupled to each of the registers. The write port receives a register identifier identifying one of the registers and receives at least a first signal, such as a bit of predicate data or a signal of a set/reset signal pair. The write port transmits the first signal and a decode signal to each of the registers. The write port is configured to assert the decode signal transmitted to the one register identified by the register identifier and to deassert the decode signal transmitted to the other registers. Each of the registers includes a set/reset latch and is configured to receive the first signal and the decode signal transmitted to it from the write port. When the first signal received by the register exhibits a first logical state and the decode signal received by the register is asserted, the register sets its set/reset latch in response to the first signal. When the first signal received by the register exhibits a second logical state and the decode signal received by the register is asserted, the register resets its set/reset latch. If the decode signal received by the register is deasserted, then the register ignores the first signal transmitted to the register from the write port.

In accordance with another feature of the present invention, the write port receives a valid signal along with the first signal and transmits the valid signal to each of the registers. The valid signal is asserted when an instruction that produced the first signal is valid (e.g., predicate enabled) and is deasserted when the instruction is invalid (e.g., predicate disabled). Each of the registers is configured to receive the valid signal and to only set or reset its set/reset latch in response to the first signal and the decode signal when the valid signal is asserted.

The present invention can also be viewed as providing a method for storing data. The method can be broadly conceptualized by the following steps: providing a plurality of registers, each of the registers having a set/reset latch; receiving at least a first signal, such as a predicate bit or a signal of a set/reset signal pair, and a register identifier identifying one of the registers; transmitting the first signal and a decode signal to each of the registers; asserting the decode signal transmitted to the one register in response to the register identifier; deasserting the decode signal transmitted to each of the other registers in response to the register identifier; setting the set/reset latch of the one register based on the asserted decode signal if the first signal received by the one register exhibits a first logical state; and resetting the set/reset latch of the one register based on the asserted decode signal when the first bit received by the one register exhibits a second logical state.

Other features and advantages of the present invention will become apparent to one skilled in the art upon examination of the following detailed description, when read in conjunction with the accompanying drawings. It is intended that all such features and advantages be included herein within the scope of the present invention and protected by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

DETAILED DESCRIPTION OF THE PREFERRED EMBODIMENT

Figure 1:
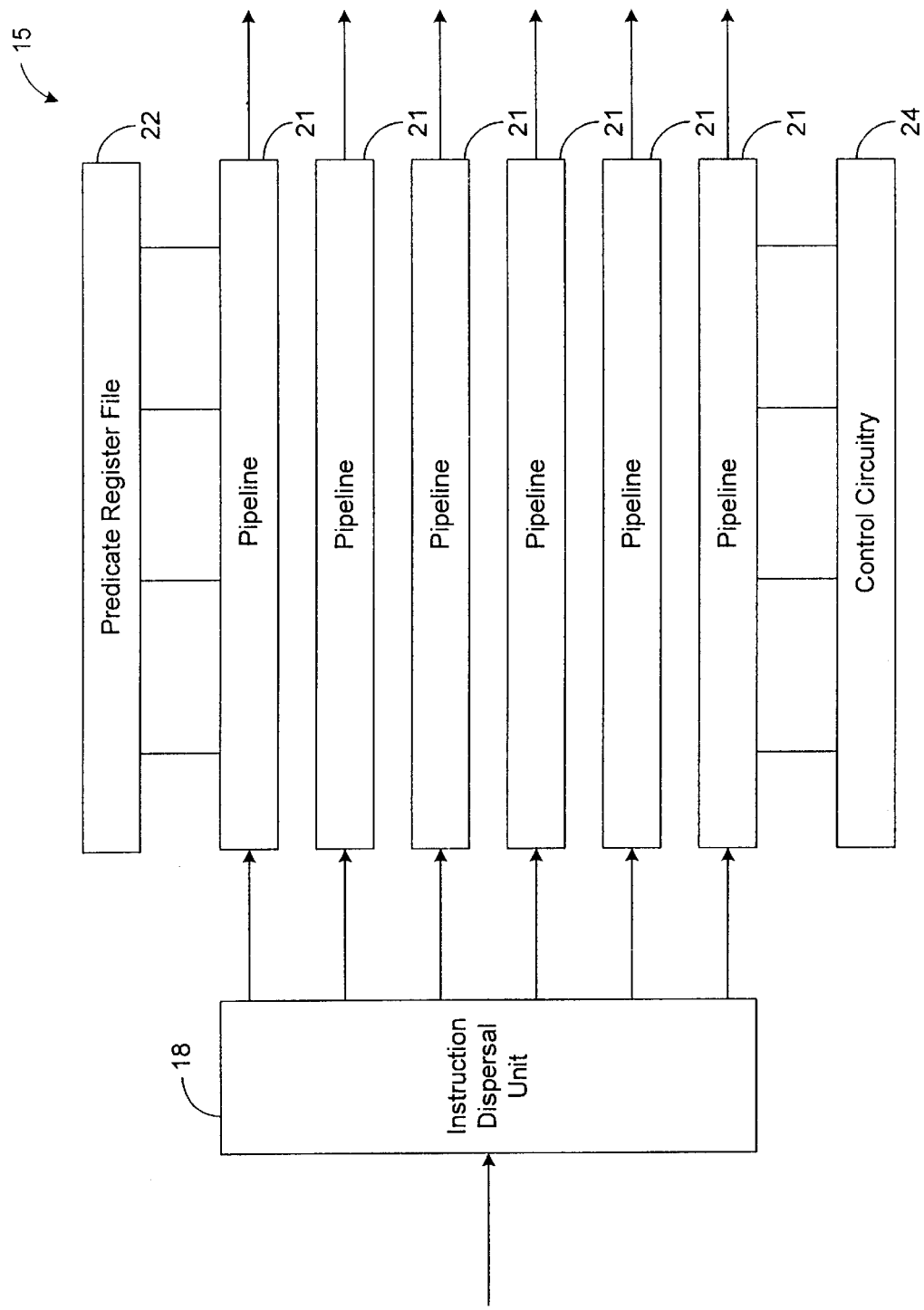
FIG. 1 is a block diagram illustrating a conventional processing system utilizing a predicate register file.

The present invention generally relates to a system and method for efficiently writing data to a predicate register file or other type of register file that includes a plurality of registers having a bit of information in each register. To illustrate the principles of the present invention, refer to FIG. 1, which depicts a conventional superscalar processing system 15. The processing system 15 includes an instruction dispersal unit 18 that receives instructions of a computer program and assigns each instruction to one of a plurality of pipelines 21. Each pipeline 21 is configured to process and, if appropriate, execute each instruction received by the pipeline 21.

Each pipeline 21 is usually configured to only process particular types of instructions (e.g., integer operation, floating point operation, memory operation, etc.). Therefore, the instruction dispersal unit 18 is configured to assign each instruction only to a pipeline 21 compatible with the instruction. Furthermore, although predicate register file 22 and control circuitry 24 are shown for simplicity as being coupled to one pipeline 21 in FIG. 1, it should be noted that each pipeline 21 is similarly coupled to the predicate register file 22 and the control circuitry 24.

The control circuitry 24 controls the processing of the instructions by the pipelines 21. For example, the control circuitry 24 analyzes the instructions being processed by the pipelines 21 and may stall any of the instructions to prevent data errors. The control circuitry 24 may be coupled to the predicate register file 22 and analyze the data stored in the predicate register file 22 in controlling the processing of the instructions by the pipelines 21. Copending and commonly assigned U.S. patent application entitled "System and Method for Providing Predicate Data," Ser. No. 09/490,395 which is incorporated herein by reference, further describes how the predicate data in the predicate register file 22 may be used to control the processing of the instructions by the pipelines 21.

Figure 2:
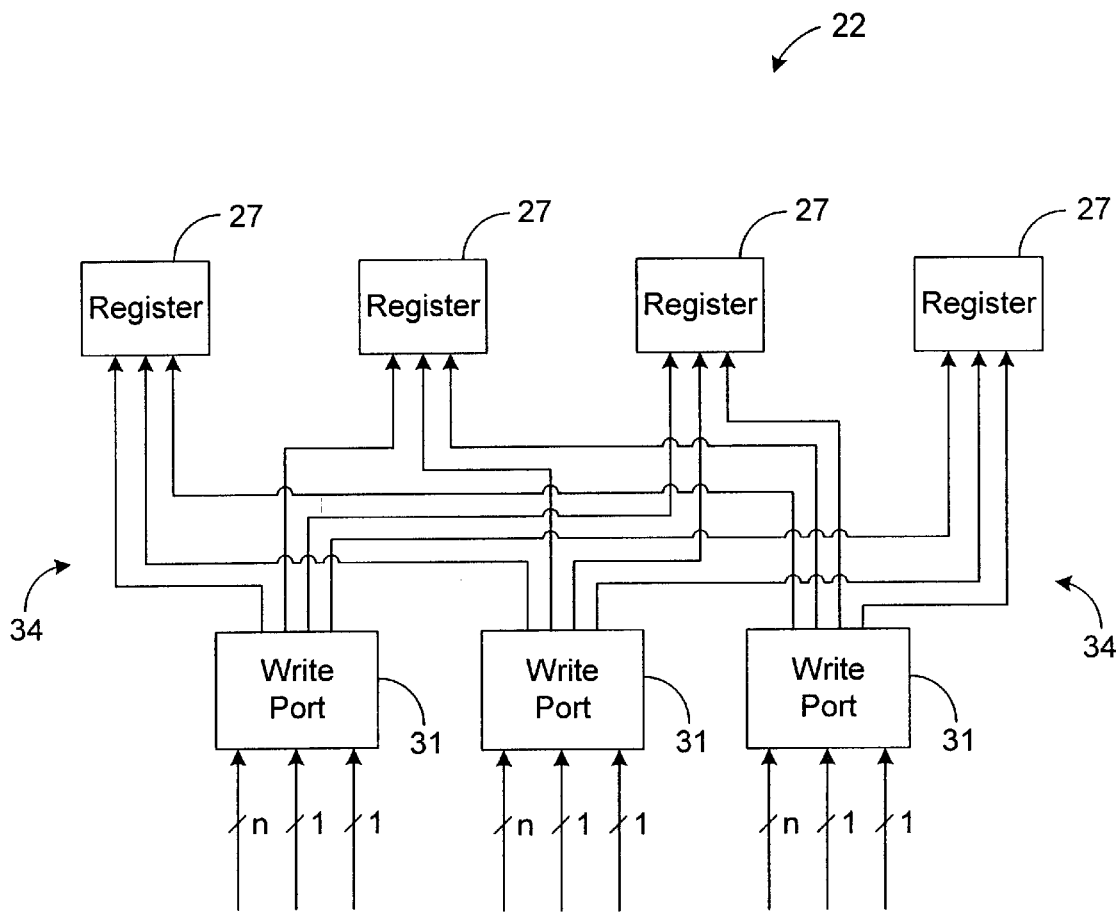
FIG. 2 is a block diagram illustrating a more detailed view of the predicate register file depicted in FIG. 1.

FIG. 2 shows a more detailed view of the predicate register file 22. As shown by FIG. 2, the predicate register file 22 includes a plurality of predicate registers 27, in which each predicate register 27 maintains one bit of predicate data. In this regard, certain instructions produce predicate data when processed by one of the pipelines 21. When a predicate bit is produced, the predicate bit is transmitted to one of the write ports 31 by the pipeline 21 processing the instruction that produced the predicate bit. The pipeline 21 also transmits to the foregoing write port 31 an n-bit register identifier (where n is any integer greater than 0) that identifies the register 27 where the predicate bit should be written.

The write port 31 receiving the predicate bit and the register identifier associated with the predicate bit transmits the predicate bit to each of the registers 27 in the register file 22. The write port 31 also transmits a decode bit to each of the registers 27 in the register file 22. The decode bit transmitted to each of the registers 27 by the foregoing write port 31 is deasserted except for the register 27 identified by the register identifier. In this regard, the write port 31 decodes the register identifier and transmits an asserted decode bit to the register 27 identified by the register identifier. The predicate register 27 receiving the asserted decode bit is configured to update the bit value contained in the register 27 based on the predicate bit received from the write port 31. The remainder of the predicate registers 27 (i.e., the predicate registers 27 that receive a deasserted decode bit from the write port 31) are designed to ignore the foregoing predicate value transmitted by the write port 31.

As a result, when a predicate bit is produced, the pipeline 21 processing the instruction that produced the predicate bit transmits the predicate bit and the register identifier associated with the predicate bit to the register file 22. The register file 22 is configured to update, based on the received predicate bit, the value contained in the predicate register 27 identified by the register identifier. The remainder of the predicate registers 27 are unaffected by the foregoing predicate bit.

In some embodiments, the instruction that produced the predicate bit may be invalid. For example, the data in the predicate register file 22 may indicate that the instruction should not be executed and should instead pass through the pipelines 21 without executing. When a predicate producing instruction is invalid, the predicate bit produced by the instruction should be ignored.

In such embodiments, a valid bit is usually transmitted to the predicate register file 22 along with the predicate bit and the register identifier associated with the predicate bit. When deasserted, the valid bit indicates that the instruction that produced the predicate bit is invalid and that the predicate bit should, therefore, be ignored. When asserted, the valid bit indicates that the instruction that produced the predicate bit is valid and that the predicate bit should not be ignored by the predicate register identified by associated register identifier. In other words, the predicate bit should be used to update one of the registers 27 when the valid bit transmitted to one of the write ports 31 along with the predicate bit is asserted.

The write port 31 receiving the predicate bit, the register identifier associated with the predicate bit, and the valid bit associated with the predicate bit (i.e., the valid bit transmitted to the write port 31 along with the predicate bit) transmits the valid bit along with the predicate bit and a decode bit to each of registers 27. If the valid bit is deasserted, then each of the registers 27 is designed to ignore the predicate bit transmitted along with the deasserted valid bit. Therefore, if the valid bit is deasserted, none of the registers 27 updates the value contained therein based on the foregoing predicate bit. However, if the valid bit is asserted, then the predicate register 27 receiving the asserted decode bit is designed to update the value contained therein based on the predicate bit. It should be noted that each of the connections 34 shown in FIG. 2 as coupling one of the write ports 31 to one of the registers 27 may be a three-bit connection so that the aforementioned predicate, decode, and valid bits may be simultaneously transmitted from the write port 31.

Figure 3:
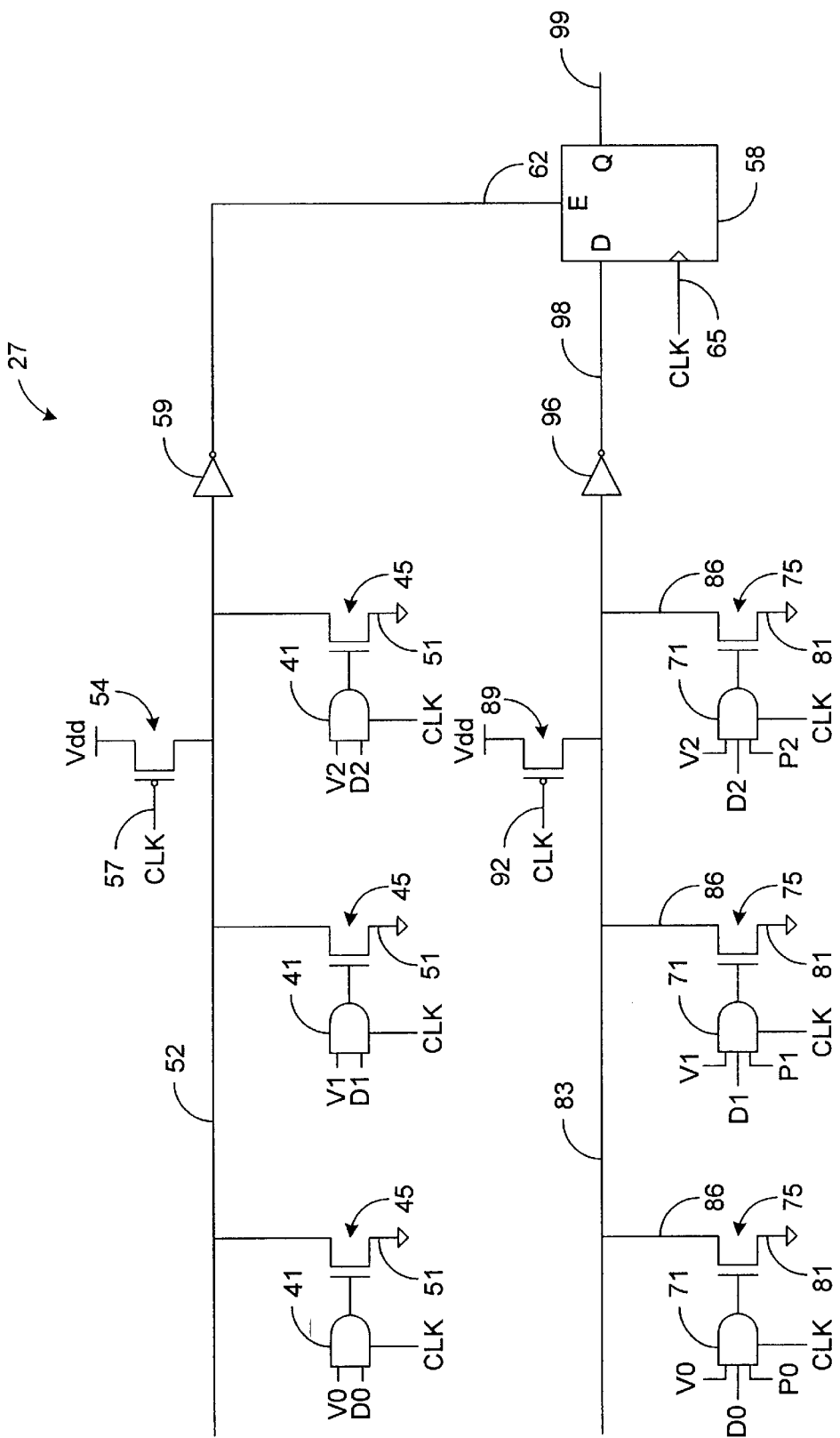
FIG. 3 is a schematic illustrating circuitry used to implement registers depicted in FIG. 2.

FIG. 3 depicts exemplary circuitry that may be used to implement each of the predicate registers 27. In this regard, each write port 31 is respectively coupled to one of the AND gates 41. Each of the AND gates 41 receives as input the valid bit and the decode bit transmitted from the write port 31 that is coupled to the AND gate 41. Therefore, an AND gate 41 produces an asserted output only when the write port 31 that is coupled to the AND gate 41 has received a predicate bit that should be used to update one of the predicate registers 27.

The output of each AND gate 41 is coupled to and controls a switching element 45, as shown by FIG. 3. The switching element 45 may be a NFET or some other type of switching mechanism. When deasserted, the output of an AND gate 41 deactivates the switching element 45 coupled to the AND gate 41, and when asserted, the output of the AND gate 41 activates the foregoing switching element 45. Furthermore, one node 51 of the switching element 45 is coupled to ground, as shown by FIG. 3. When activated, the switching element 45 electrically couples the ground node 51 of the switching element 45 to connection 52. When deactivated, the switching element 45 operates as an open circuit and, therefore, isolates connection 52 from the ground node 51 of the switching element 45. Accordingly, if the output of any AND gate 41 is asserted, then connection 52 is forced to ground, and if the output of each AND gate 41 is deasserted, then connection 52 is isolated from ground.

During each clock cycle, the connection 52 is pre-charged or, in other words, temporarily asserted. For example, in the embodiment shown by FIG. 3, the voltage of connection 52 is temporarily forced to a logical high voltage $V_{dd}$. In this regard, the connection 52 is coupled to $V_{dd}$ through a switching element 54, as shown by FIG. 3. The switching element 54 may be a PFET or some other type of switching mechanism. The switching element 54 is controlled by a clock signal received via connection 57. During a first half of a clock cycle, the clock signal exhibits a first logical state and toggles to a second logical state at the beginning of the second half of the clock cycle. In response to the first logical state of the clock signal, the switching element 54 electrically couples connection 52 to $V_{dd}$, thereby forcing the voltage of the connection 52 to $V_{dd}$ or, in other words, pre-charging connection 52. In response to the second logical state of the clock signal, the switching element 54 operates as an open circuit and, therefore, isolates connection 52 from $V_{dd}$.

Furthermore, each AND gate 41 also receives the aforementioned clock signal as an enable input. In response to the first logical state of the clock signal, each AND gate 41 is disabled or, in other words, transmits a deasserted output regardless of the data input state of the AND gate 41. Therefore, during the pre-charging of the connection 52, each of the switching elements 45 is deactivated, thereby isolating connection 52 from ground.

Furthermore, in response to the second logical state of the clock signal, each AND gate 41 is enabled. Therefore, the voltage of connection 52 remains at $V_{dd}$ during the second half of the clock cycle only if each of the AND gates 41 produces a deasserted output. If any of the AND gates 41 produces an asserted output, then at least one of the switching elements 45 is activated, thereby grounding connection 52.

As shown by FIG. 3, connection 52 is coupled to the input of an inverter 59. The output of the inverter 59 is coupled to an enable port (E) 62 of a DQ latch 58. Therefore, during the first half of the aforementioned clock cycle, the enable port 62 should receive a deasserted value. During the second half of the clock cycle, the enable port 62 should continue to receive a deasserted valued if each of the switching elements 45 is deactivated. However, if any of the switching elements 45 is activated, then the enable port 62 of the latch 58 should receive an asserted value.

Furthermore, the latch 58 is enabled when the enable port 62 of the latch 58 receives an asserted value. Therefore, the latch 58 may be enabled during the second half of the clock cycle (i.e., after pre-charging) depending on the input values received by the AND gates 41. In this regard, the latch 58 should be enabled during the second half a clock cycle, when one of the AND gates 41 simultaneously receives an asserted valid bit and an asserted decode bit as input during the second half of the clock cycle.

Each write port 31 is also respectively coupled to an AND gate 71. Each of the AND gates 71 receives as data input the valid bit, the decode bit, and the predicate bit transmitted from the write port 31 that is coupled to the AND gate 71. Therefore, an AND gate 71 produces an asserted output only when the write port 31 that is coupled to the AND gate 41 has received an asserted predicate bit that should be used to update one of the predicate registers 27.

The output of each AND gate 71 is coupled to and controls a switching element 75, as shown by FIG. 3. The switching element 75 may be a NFET or other type of switching mechanism. When deasserted, the output of an AND gate 71 deactivates the switching element 75 coupled to the AND gate 71, and when asserted, the output of the AND gate 71 activates the foregoing switching element 75. Furthermore, one node 81 of the switching element 75 is coupled to ground, as shown by FIG. 3. When activated, the switching element 75 electrically couples connection 83 to the ground node 81 of the switching element 75. When deactivated, the switching element 75 operates as an open circuit and, therefore, isolates connection 83 from the ground node 81 of the switching element 75. Accordingly, if the output of any AND gate 71 is asserted, then connection 83 is forced to ground, and if the output of each AND gate 71 is deasserted, then connection 83 is isolated from ground.

During each clock cycle, the connection 83 is pre-charged or, in other words, temporarily asserted, similar to the pre-charging of connection 52. Therefore, in the previously described embodiment shown by FIG. 3, the voltage of connection 83 is temporarily forced to $V_{dd}$ during the first half of the clock cycle. In this regard, the connection 83 is coupled to $V_{dd}$ through a switching element 89, as shown by FIG. 3. The switching element 89 may be a PFET or some other type of switching mechanism. The switching element 89 is controlled by the aforementioned clock signal, which is received via connection 92. As previously described, during a first half of a clock cycle, the clock signal exhibits a first logical state and toggles to a second logical state at the beginning of the second half of the clock cycle. In response to the first logical state of the clock signal, the switching element 89 electrically couples connection 83 to $V_{dd}$, thereby forcing the voltage of the connection 83 to $V_{dd}$ or, in other words, pre-charging connection 83. In response to the second logical state of the clock signal, the switching element 89 operates as an open circuit and, therefore, isolates connection 83 from $V_{dd}$.

Furthermore, each AND gate 71 also receives the aforementioned clock signal as an enable input. In response to the first logical state of the clock signal, each AND gate 71 is disabled or, in other words, transmits a deasserted output regardless of the data input state of the AND gate 71. Therefore, during the pre-charging of the connection 83, each of the switching elements 75 is deactivated, thereby isolating connection 83 from ground.

Furthermore, in response to the second logical state of the clock signal, each AND gate 71 is enabled. Therefore, the voltage of connection 83 remains at $V_{dd}$ during the second half of the clock cycle only if each of the AND gates 71 produces a deasserted output. If any of the AND gates 71 produces an asserted output, then at least one of the switching elements 75 is activated, thereby grounding connection 83.

As shown by FIG. 3, connection 83 is coupled to the input of an inverter 96. The output of the inverter 96 is coupled to a data input port (D) 98 of DQ latch 58. Therefore, during the first half of the aforementioned clock cycle, the data input port 98 should receive a deasserted value. During the second half of the clock cycle, the input port 98 should continue to receive a deasserted valued if each of the switching elements 75 is deactivated. However, if any of the switching elements 75 is activated, then the data input port 98 of the latch 58 should receive an asserted value.

As shown by FIG. 3, the latch 58, via connection 65, receives the aforementioned clock signal. At the end of the clock cycle, the clock signal again toggles, and in response, the latch 58 forces the logical value of its output port (Q) 99 to the logical value of its data input port 98 if the latch 58 is enabled. If the latch 58 is not enabled when the clock signal toggles at the end of the clock cycle, then the latch 58 does not change the value on the output connection 99.

As a result, when a valid instruction being processed by one of the pipelines 21 (FIG. 1) produces a predicate bit, the predicate bit along with an asserted valid bit and a register identifier is simultaneously transmitted to one of the write ports 31 (FIG. 2). In response, the write port 31 decodes the register identifier and transmits an asserted decode bit to the predicate register 27 identified by the register identifier. The write port 31 also transmits a deasserted decode bit to the other predicate registers 27. Along with each decode bit, the write port also transmits the received predicate bit and valid bit.

One of the AND gates 41 in each of the predicate registers 27 receives both the valid bit and a decode bit as input. Furthermore, one of the AND gates 71 in each of the predicate registers 27 receives the valid bit, the decode bit, and the predicate bit as data input. As a result, the data transmitted by the foregoing write port 31 does not affect the value of the latch 58 in each of the predicate registers 27 that receives a deasserted decode bit. In this regard, the deasserted decode bit prevents the AND gates 41 and 71 receiving the deasserted decode bit from producing an asserted output and, therefore, from activating the switching elements 45 and 75 respectively coupled to the foregoing AND gates 41 and 71.

However, the predicate register 27 identified by the register identifier receives an asserted decode bit from the aforementioned write port 31. Therefore, the data transmitted to this register 27 from the write port 31 may affect the data contained in the latch 58 of the register 27. In this regard, the asserted decode bit and valid bit from the write port 31 cause one of the AND gates 41 to produce an asserted output during the second half of a clock cycle (i.e., after pre-charging of the connection 52) and, therefore, to activate one of the switching elements 45. As a result, the latch 58 is enabled during the second half of the clock cycle.

Furthermore, one of the AND gates 71 of the foregoing register 27 simultaneously receives the valid bit, the decode bit, and the predicate bit from the aforementioned write port 31. Since both the valid bit and a decode bit are asserted for this register 27, the output of the AND gate 71 corresponds to the value of the predicate bit.

If the predicate bit is asserted, then the output of the foregoing AND gate 71 is asserted, and the switching element 75 coupled to the AND gate 71 is activated. Therefore, connection 83 is grounded during the second half of the clock cycle, and the data input port 98 receives an asserted value when the clock signal on connection 65 toggles at the end of the clock cycle. As a result, the value of the output port 99 is forced to an asserted value when the clock signal toggles at the end of the clock cycle.

If, on the other hand, the predicate bit is deasserted, then the output of the foregoing AND gate 71 is deasserted, and the switching element 75 coupled to the AND gate 71 is deactivated. Therefore, connection 83 should remain asserted after pre-charging, assuming that no other AND gate 71 coupled to another write port 31 produces an asserted output. As a result, the data input port 98 receives a deasserted value when the clock signal on connection 65 toggles at the end of the clock cycle, and the value of the output port 99 is forced to a deasserted value at this time.

According to the foregoing techniques, each predicate bit produced via the processing of a valid instruction in one of the pipelines 21 updates the value contained in the latch 58 of one of the predicate registers 27. Furthermore, the value of the output port 99 represents the value contained in the predicate register 27 and may be read at any time via control circuitry 24 to control the processing of instructions in the pipelines 21, as described hereinbefore in the Background section.

Figure 4:
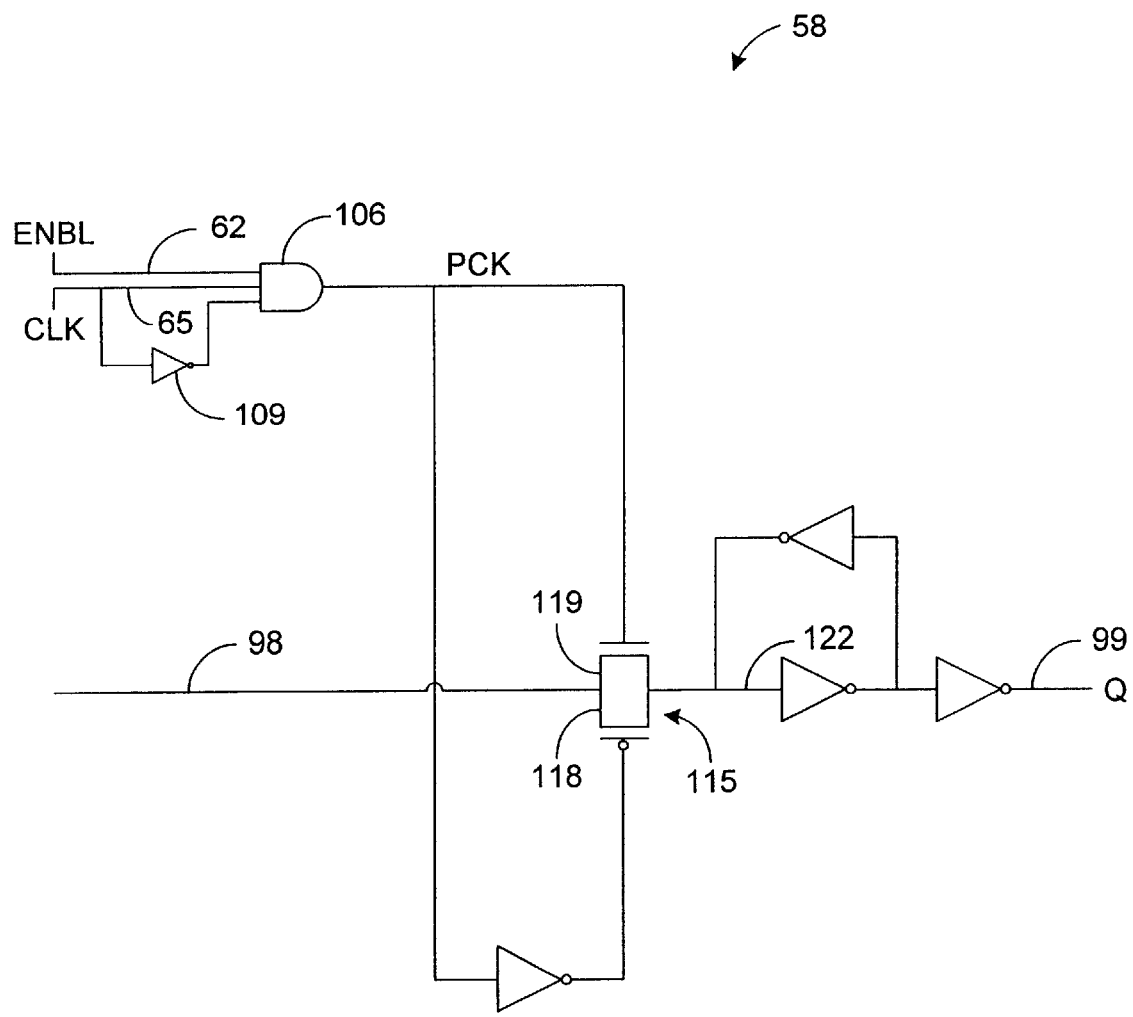
FIG. 4 is a schematic illustrating circuitry used to implement a DQ latch depicted in FIG. 3.

FIG. 4 depicts exemplary circuitry that may be used to implement latch 58. As shown by FIG. 4, the enable signal received via port 62 and the clock signal received via connection 65 are input into an AND gate 106. Furthermore, the foregoing clock signal is also input into an inverter 109, and the output of the inverter 109 is input into the AND gate 106. Therefore, the AND gate 106 also receives the inverse of the clock signal as an input. However, the inverse of the clock signal is delayed a small amount by inverter 109. Therefore, the output of the AND gate 106 should produce an impulse (PCK) every clock cycle.

This impulse is used to control a transmission gate 115. Although other devices can be used to implement transmission gate 115, the transmission gate 115 in the embodiment shown by FIG. 4 is comprised of two switching elements 118 and 119, such as a PFET and a NFET, respectively. One of the switching elements 119 receives the impulse as a control signal, and the other switching element 118 receives the inverse of the impulse as a control signal. The transmission gate 115 is configured to set the value of connection 122 to the value of the data input port 98 when the AND gate 106 produces an impulse. The value of connection 122 is then output across connection 99 as the data value (Q) contained in the latch 58.

A problem with the design of the latch 58 shown by FIG. 4 is that the enable signal must be asserted by the time the clock signal toggles for an impulse to be produced. In other words, if the enable signal on connection 62 is not asserted by the time the clock signal toggles at the end of a clock cycle, then the value contained in the latch 58 cannot be updated until the end of the next clock cycle. In some situations, the predicate data that is to update a register 27 may be received by the register 27 before, but close to, the end of a clock cycle. Due to the delays in asserting the enable signal, the value of the enable port 62 may not be asserted by the time the clock signal toggles at the end of the same clock cycle. Therefore, an impulse will not be produced by the AND gate 106 during the foregoing clock cycle, and the register 27, therefore, will not be updated until the next clock cycle. Since it is desirable to update the predicate data in the register file 22 as soon as possible, it would be desirable for the configuration of latch 58 to enable late arriving predicate data (i.e., predicate data arriving just before the end of a clock cycle) to update the register 27.

The present invention generally provides a latch that may be implemented within a predicate register and that allows late arriving predicate data to update the predicate register. To illustrate the principles of the present invention, refer to FIG. 5, which depicts a processing system 150 in accordance with the present invention. As can be seen by comparing FIG. 5 to FIG. 1, the processing system 150 can be identical to processing system 15 except that a register file 152 is utilized instead of register file 22. Furthermore, as can be seen by comparing FIG. 6 to FIG. 2, the register file 152 can be identical to conventional register file 22 except for the configuration of the predicate registers 160.

Figure 7:
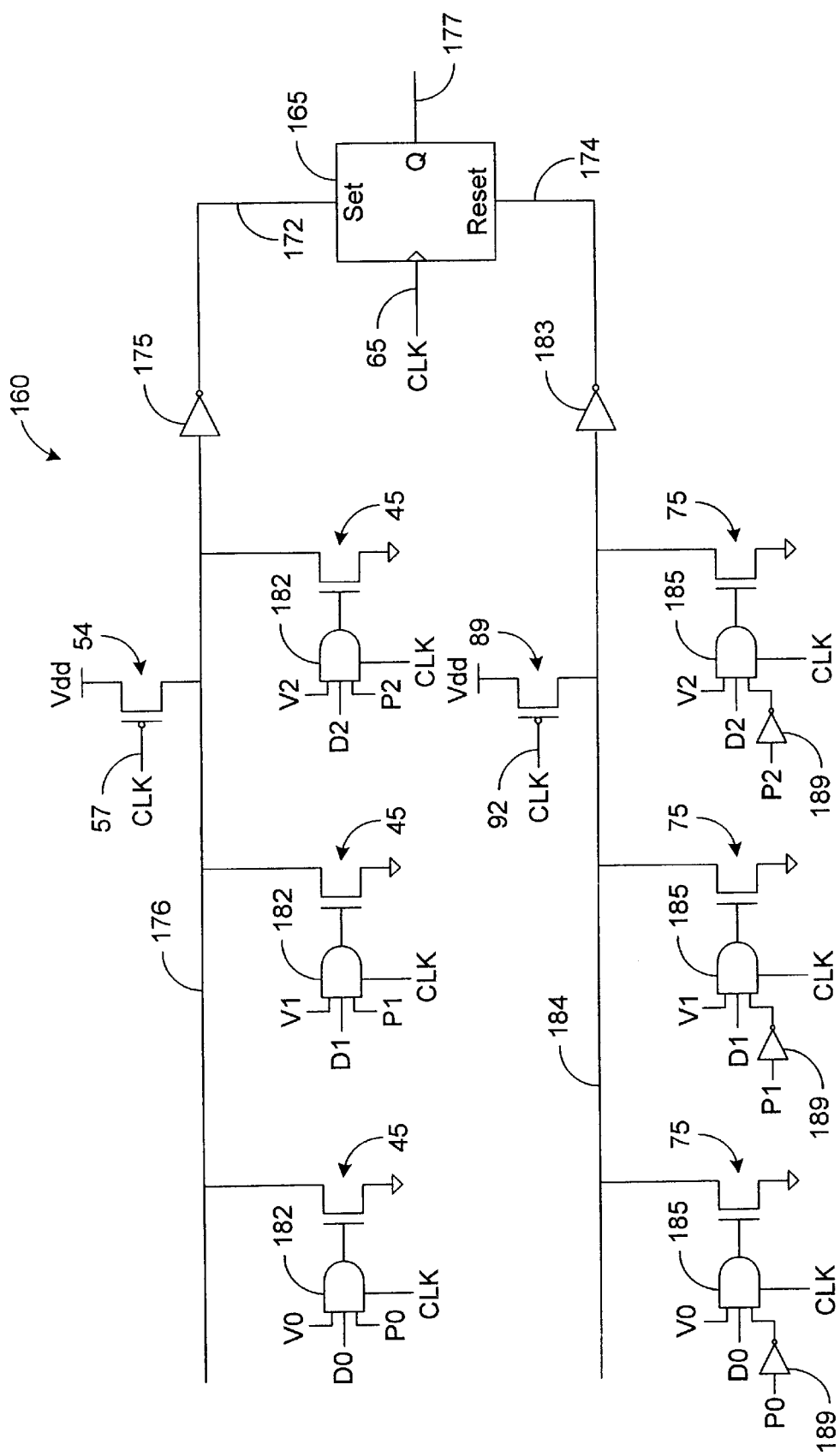
FIG. 7 is a schematic illustrating exemplary circuitry that may be used to implement registers depicted in FIG. 6.

FIG. 7 depicts exemplary circuitry that may be used to implement each of the predicate registers 160 of the present invention. As shown by FIG. 7, the predicate register 160 of the present invention utilizes a set/reset latch 165 instead of a DQ latch 58, as used by the conventional register 27 depicted by FIG. 3. The set/reset latch 165 operates similar to other known set/reset latches. In this regard, the set/reset latch 165 includes a set port (S) 172 and a reset port (R) 174. When the clock signal received by connection 65 toggles and the signal received by the set port 172 is asserted, the latch 165 is designed to assert the output value (Q) on connection 177. When the clock signal received by connection 65 toggles and the signal received by reset port 174 is asserted, the latch 165 is designed to deassert the output value (Q) on connection 177.

The set port 172 is coupled to the output of an inverter 175, and the input of the inverter 175 is coupled to connection 176. The connection 176 is coupled to $V_{dd}$ through a switching element 54 and is pre-charged during the first half of a clock cycle of the same clock signal (CLK) received by latch 165, similar to connection 52 of FIG. 3. In this regard, the switching element 54 is configured to receive the clock signal via connection 57 and to electrically couple the connection 176 to $V_{dd}$ during the first half of the clock cycle of the clock signal and to electrically isolate the connection 176 from $V_{dd}$ during the last half of the clock cycle.

Similar to the predicate register 27 of FIG. 3, the predicate register 160 includes an AND gate 182 for each write port 31 of the register file 152. Similar to AND gates 41 of FIG. 3, the output of each AND gate 182 is coupled to a switching element 45. The switching elements 45 operate the same as in the embodiment depicted by FIG. 3. Therefore, each of the switching elements 45 is activated in response to an asserted output from a respective one of the AND gates 182, and each of the switching elements 45 is deactivated in response to a deasserted output from a respective one of the AND gates 182. When deactivated, the switching elements 45 operate as open circuits. When activated, the switching elements 45 electrically couple the connection 176 to ground. Furthermore, similar to AND gates 41 of conventional register 27, the AND gates 182 are disabled by the clock signal during the pre-charging of connection 176 and are enabled by the clock signal after the pre-charging of connection 176.

Each of the AND gates 182 receives the data simultaneously transmitted from a respective one of the write ports 31. In this regard, an AND gate 182 coupled to a write port 31 receives a valid bit, a decode bit, and a predicate bit simultaneously transmitted from the write port 31. If the decode bit and the valid bit received by the AND gate 182 are asserted, then the predicate bit simultaneously received by the AND gate 182 has been produced via the processing of a valid instruction and should be used to update the value output by latch 165. In particular, if the predicate bit is asserted, then the AND gate 182 is designed to produce an asserted output. As a result, the switching element 45 coupled to the AND gate 182 is activated. Therefore, the connection 176 is grounded, and the set port 172 receives an asserted signal from inverter 175. In response to this asserted signal, the latch 165 asserts the output value (Q) transmitted across connection 177. Accordingly, if the predicate register 160 receives an asserted predicate value that should be used to update the value of latch 165, one of the AND gates 182 activates the switching element 45 coupled to the AND gate 182, thereby setting latch 165 when the clock signal toggles at the end of the clock cycle.

If, on the other hand, the valid bit, the decode bit, or the predicate bit received by the AND gate 182 is deasserted, then the AND gate 182 is designed to produce a deasserted output. As a result, the switching element 45 coupled to the AND gate 182 is deactivated, and the connection 176 is maintained at $V_{dd}$, assuming no other AND gate 182 produces an asserted output. Therefore, the set port 172 receives a deasserted signal from inverter 175 and fails to change the output value transmitted across connection 177 in response to the deasserted signal from inverter 175.

The reset port 174 is coupled to the output of an inverter 183, and the input of the inverter 183 is coupled to connection 184. The connection 184 is coupled to $V_{dd}$ through a switching element 89 and is pre-charged during the first half of the aforementioned clock cycle, similar to connection 83 of FIG. 3. In this regard, the switching element 89 is configured to receive the same clock signal received by latch 165. Based on the received clock signal, the switching element 89 is designed to electrically couple the connection 184 to $V_{dd}$ during the first half of the clock cycle of the clock signal and to electrically isolate the connection 184 from $V_{dd}$ during the last half of the clock cycle.

The predicate register 160 also includes an AND gate 185 for each write port 31 of the register file 152. Similar to the AND gates 71 of FIG. 3, the output of each AND gate 185 is coupled to a switching element 75. The switching elements 75 operate the same as in the embodiment depicted by FIG. 3. Therefore, each of the switching elements 75 is activated in response to an asserted output from a respective one of the AND gates 185, and each of the switching elements 75 is deactivated in response to a deasserted output from a respective one of the AND gates 185. When deactivated, the switching elements 45 operate as open circuits, and when activated, the switching elements 45 electrically couple the connection 184 to ground. Furthermore, similar to AND gates 71 of conventional registers 27, the AND gates 185 are disabled by the clock signal during the pre-charging of connection 184 and are enabled by the clock signal after the pre-charging of connection 184.

Similar to AND gates 182, each of the AND gates 185 receives the data simultaneously transmitted from a respective one of the write ports 31. In this regard, an AND gate 182 coupled to a write port 31 receives the valid bit, the decode bit, and the predicate bit simultaneously transmitted from the write port 31. However, the predicate bit received by each AND gate 185 passes through an inverter 189 and is, therefore, inverted. If the valid bit, the decode bit, and the inverted predicate bit received by an AND gate 182 are asserted, then the AND gate 182 is designed to produce an asserted output. As a result, the switching element 75 coupled to the AND gate 185 is activated. Therefore, the connection 184 is grounded, and the reset port 174 receives an asserted signal from inverter 183. In response to this asserted signal, the latch 165 deasserts the output value (Q) transmitted across connection 177. Accordingly, if the predicate register 160 receives a deasserted predicate value that should be used to update the value of latch 165, one of the AND gates 185 activates the switching element 75 coupled to the AND gate 185, thereby resetting latch 165 when the clock signal toggles at the end of the clock cycle.

If, on the other hand, the valid bit, the decode bit, or the inverted predicate bit received by an AND gate 182 is deasserted, then the AND gate 182 is designed to produce a deasserted output. As a result, the switching element 75 coupled to the AND gate 185 is deactivated, and the connection 184 is maintained at $V_{dd}$, assuming no other AND gate 185 produces an asserted output. Therefore, the reset port 174 receives a deasserted signal from inverter 183 and fails to change the output value transmitted across connection 177 in response to the deasserted signal from inverter 183.

Figure 8:
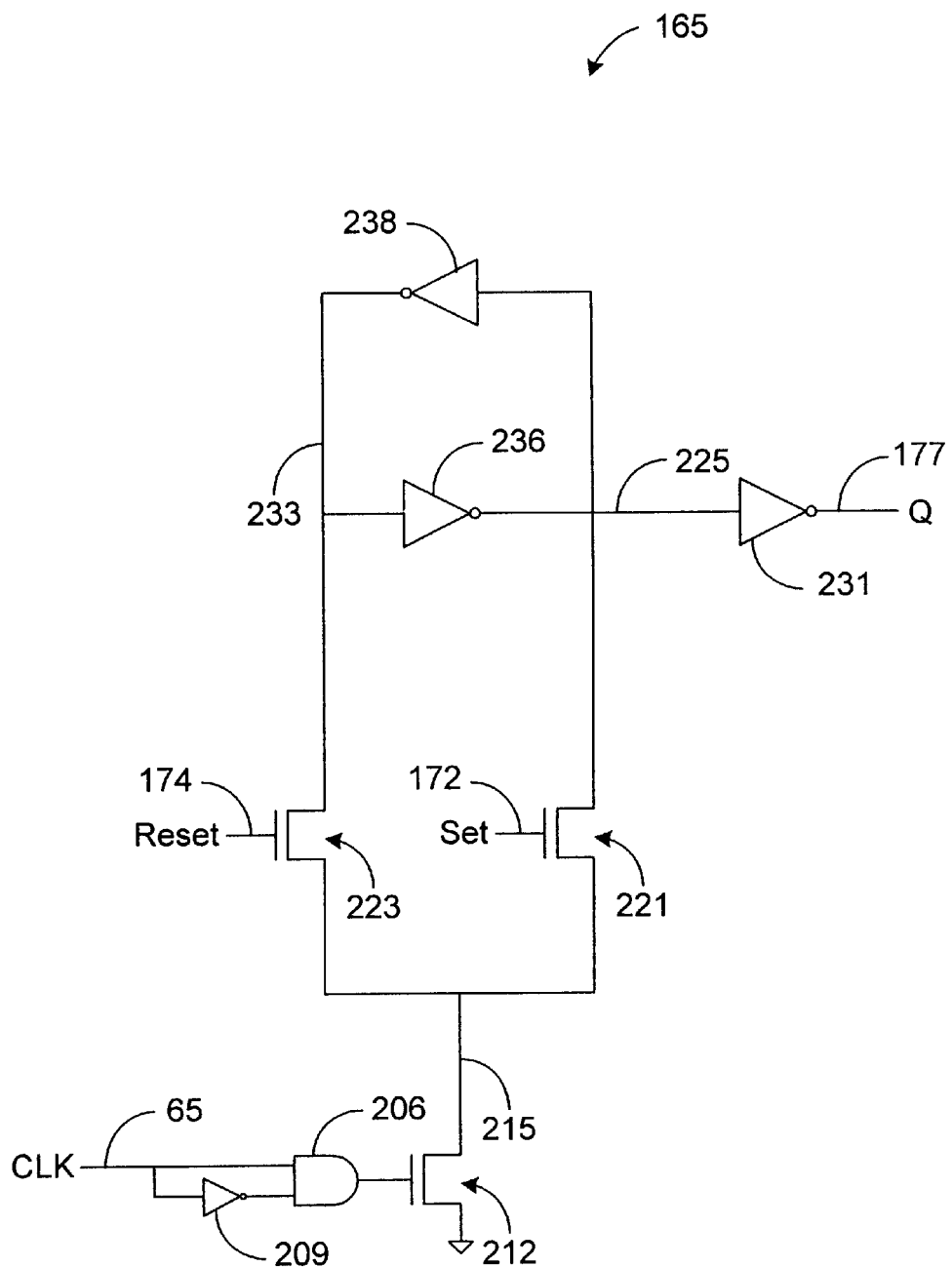
FIG. 8 is a schematic illustrating exemplary circuitry that may be used to implement a set/reset latch depicted in FIG. 7.

FIG. 8 shows exemplary circuitry that may be used to implement the set/reset latch 165. As shown by FIG. 8, the foregoing circuitry includes an AND gate 206 that receives the clock signal on onnection 65 as an input. The AND gate 206 also receives the inverse of the foregoing clock signal as an input via inverter 209. There is a finite amount of delay associated with inverter 209, and the AND gate 206, therefore, produces an impulse each time the clock signal toggles.

The output of the AND gate 206 is used to control a switching element 212. Although other devices may be used to implement the switching element 212, the switching element 212 shown in FIG. 8 is a NFET. When the switching element 212 receives an impulse, the switching element 212 electrically couples connection 215 to ground. Otherwise, the switching element 212 operates as an open circuit and electrically isolates connection 215 from ground.

The latch 165 also includes two switching elements 221 and 223. Although other devices may be used to implement the switching elements 221 and 223, the switching elements 221 and 223 shown in FIG. 8 are NFETs. The switching elements 221 and 223 are respectively controlled via the signals received by set port 172 and reset port 174. In this regard, if the signal received by set port 172 is asserted when the AND gate 206 produces an impulse, then node 225 is grounded. Furthermore, node 225 is coupled to an input of inverter 231. Therefore, when node 225 is grounded, the value (Q) on connection 177 is asserted. Conversely, if the signal received by reset port 174 is asserted when the AND gate 206 produces an impulse, then node 233 is grounded. Node 233 is coupled to node 225 via inverters 236 and 238, as shown by FIG. 8. Therefore, when node 233 is grounded, the value (Q) on connection 177 is deasserted.

As can be seen by examining FIG. 8, it is not necessary for the latch 165 to be enabled. Therefore, predicate data may arrive at register 160 closer to the end of a clock cycle without having to wait until the next clock cycle to update the register 160. Accordingly, it is more likely, relative to register 27, that predicate data arriving during a clock cycle will update the register 160 during the same clock cycle.

It should be noted that the present invention has been described herein as pre-charging during the first half of a clock cycle and updating a latch 165 during the last half of a clock cycle. However, it should be apparent to one skilled in the art that other timing and circuit schemes may be utilized to implement the present invention.

Furthermore, in describing the preferred embodiment of the present invention, it is assumed that the architecture of the processing system 150 is such that only predicate data having the same value may update the same register 160 during the same clock cycle and, therefore, may be transmitted to the register file 152 during the same clock cycle. It should be apparent to one skilled in the art that the configuration of the embodiment depicted by FIG. 7 may need to be modified if multiple predicate bits having different values may update the same predicate register 160 during the same clock cycle.

Figure 9:
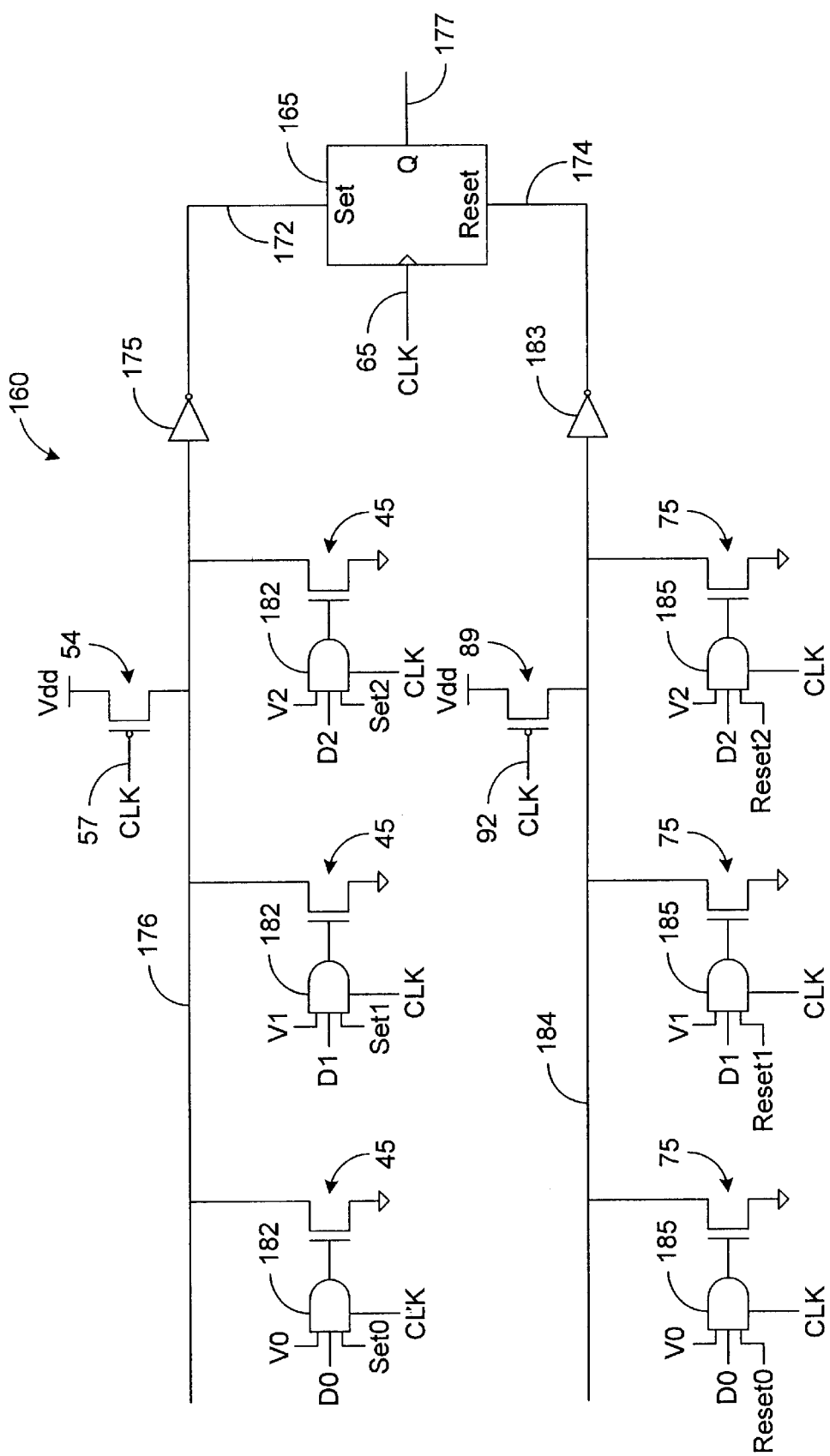
FIG. 9 is a schematic illustrating another embodiment of circuitry that may be used to implement the registers depicted in FIG. 6.

FIG. 9 depicts another embodiment of circuitry that may be used to implement the predicate registers 160. The circuitry of FIG. 9 is similar to and operates similar to the circuitry shown by FIG. 7. However, instead of receiving a predicate bit from each write port 31, the register 160 receives a pair of set and reset signals from each write port 31. In this regard, the set signal is asserted when the value in the latch 165 should be asserted, and the reset signal should be asserted when the value in the latch 165 should be deasserted. As shown by FIG. 9, the set signal from each write port 31 is received by one of the AND gates 182 in lieu of the predicate bit, and the reset signal from each write port 31 is received by one of the AND gates 185 in lieu of the inverse of the predicate bit. As a result, the value of the latch 165 should be asserted when one of the AND gates 182 receives an asserted valid bit, decode bit, and set signal, and the value of the latch 165 should be deasserted when one of the AND gates 185 receives an asserted valid bit, decode bit, and reset signal. In this embodiment, inverters 189 are not necessary.

It should be noted that it is possible to utilize "wired or" structures in implementing the circuitry shown by FIGS. 7 and 9. However, it is possible for other types of wide or structures to be used, if desired.

Operation

The preferred use and operation of the processing system 150 and associated methodology are described hereafter.

Figure 5:
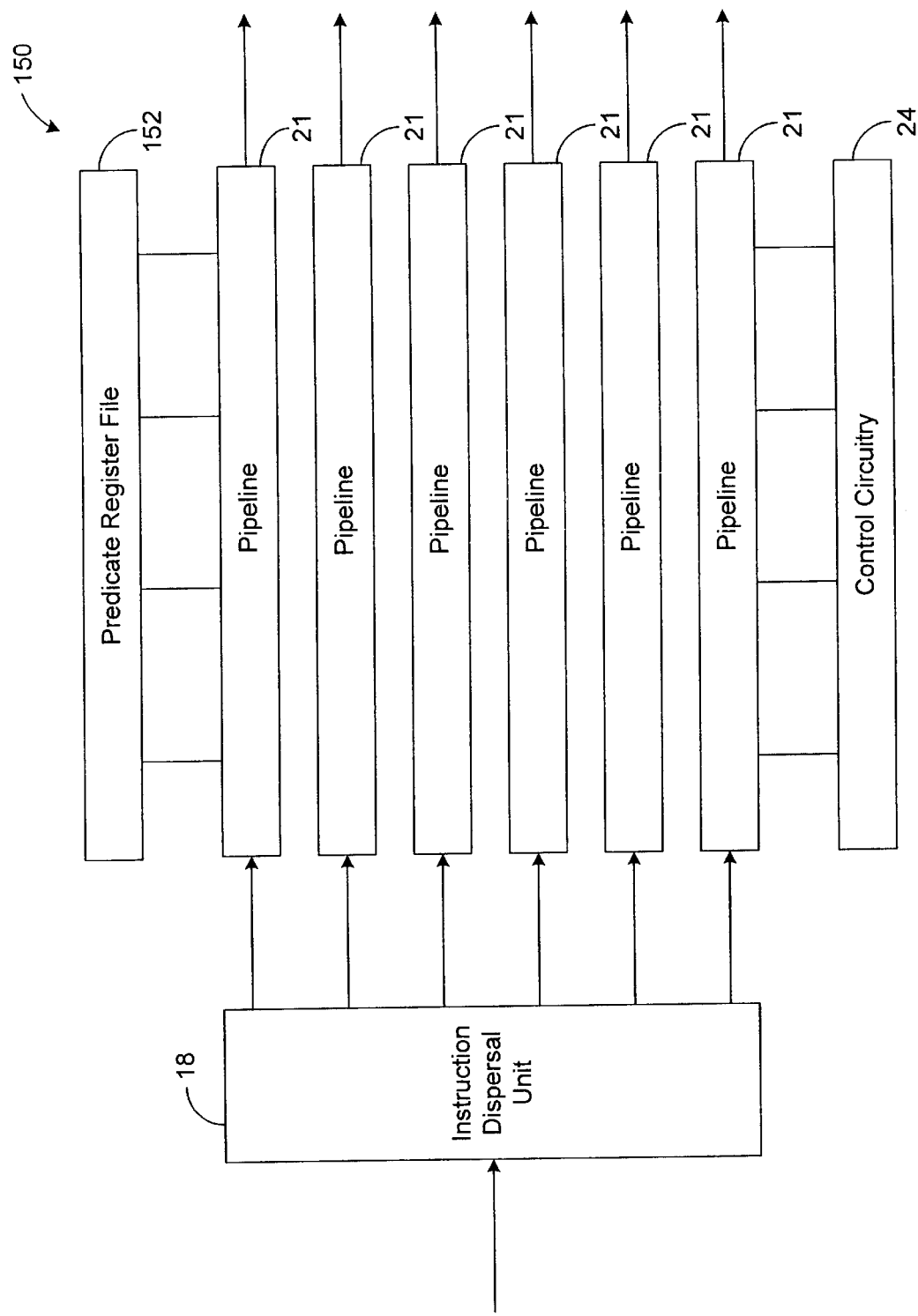
FIG. 5 is a block diagram illustrating a processing system utilizing a predicate register file in accordance with the present invention.
Figure 6:
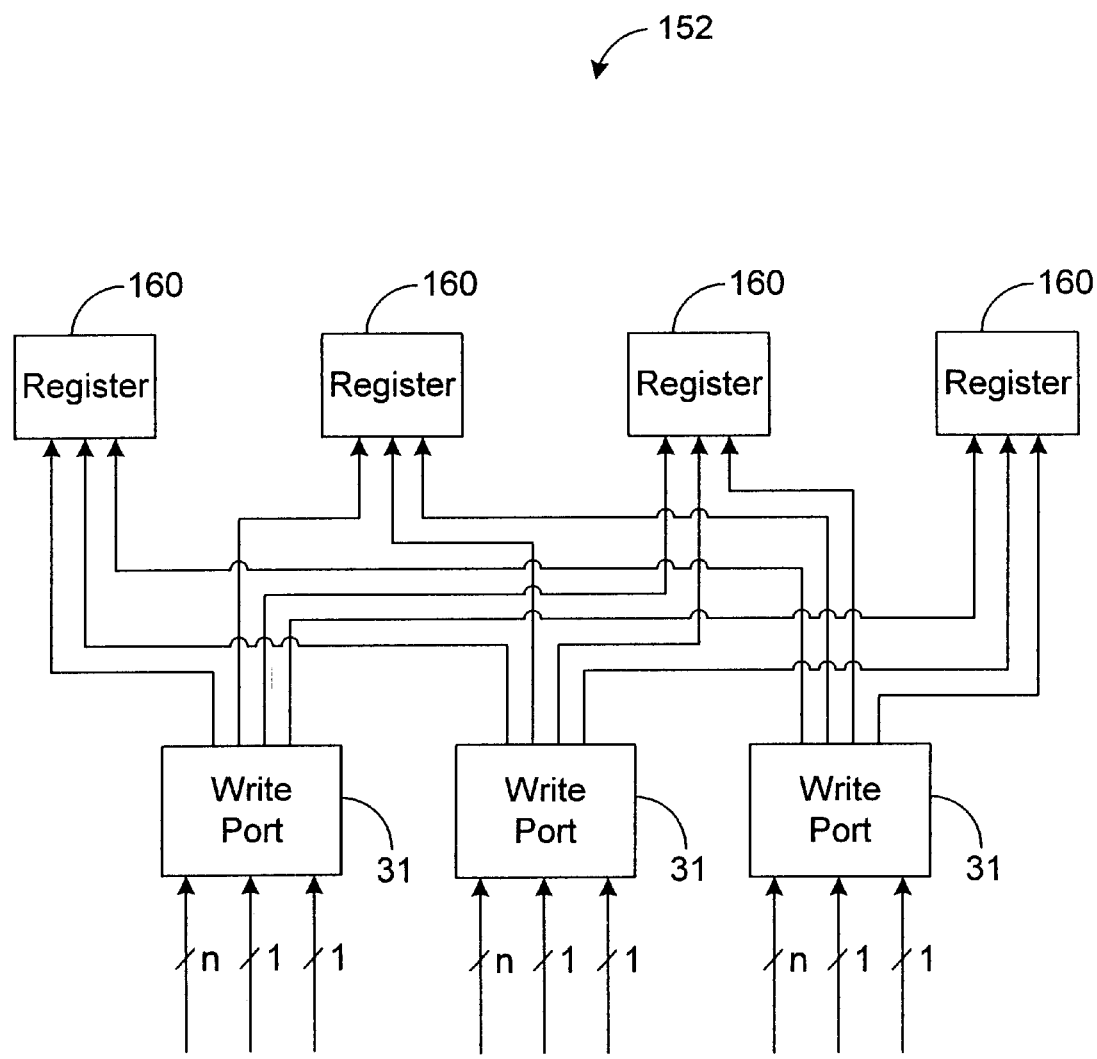
FIG. 6 is a block diagram illustrating a more detailed view of the predicate register file depicted in FIG. 5.

Assume that an instruction being processed by one of the pipelines 21 of FIG. 5 produces a predicate bit and that the foregoing instruction is valid. In this situation, the pipeline 21 processing instruction transmits to the register file 152 the predicate bit, an asserted valid bit, and the register identifier identifying the predicate register 160 that is to be updated by the predicate bit.

One of the write ports 31 receives the foregoing data and decodes the register identifier to determine which of the predicate registers 160 is to be updated by the predicate bit. This write port 31 transmits the received predicate bit, the asserted valid bit, and a decode bit to each of the predicate registers 160. The decode bit transmitted to the predicate register 160 identified by the received register identifier is asserted. The remainder of the decode bits transmitted to the other predicate registers 160 are deasserted. As a result, the predicate register 160 identified by the foregoing register identifier is updated, and the other predicate registers 160 are unaffected by the data transmitted from the foregoing write port 31.

An AND gate 182 (FIG. 7) of the predicate register 160 identified by the aforementioned register identifier receives as input the asserted valid bit, the asserted decode bit, and the predicate bit transmitted by the write port 31. If the predicate bit transmitted by the write port 31 is asserted, then the foregoing AND gate 182 produces an asserted output after the connection 176 is pre-charged. As a result, the switching element 45 coupled to the foregoing AND gate 182 is activated, and the connection 176 is grounded. Therefore, the set port 172 receives an asserted signal. In response, the set/reset latch 165 asserts the output value (Q) on connection 177 once the clock signal on connection 65 toggles at the end of the clock cycle.

If the predicate bit is deasserted, then the foregoing AND gate 182 produces a deasserted output, and the switching element 45 coupled to the AND gate 182 is deactivated. Assuming that no other AND gate 182 produces an asserted output, the voltage of connection 176 remains at $V_{dd}$. Therefore, the set port 172 receives a deasserted signal, and the output value (Q) on connection 177 is unaffected by the output of the foregoing AND gate 182.

Furthermore, an AND gate 185 of the predicate register 160 identified by the aforementioned register identifier receives as input the asserted valid bit, the asserted decode bit, and an inverse of the predicate bit transmitted by the write port 31. If the inverse of the predicate bit transmitted by the write port 31 is asserted, then the foregoing AND gate 185 produces an asserted output after the connection 184 is pre-charged. As a result, the switching element 75 coupled to the foregoing AND gate 185 is activated, and the connection 184 is grounded. Therefore, the reset port 174 receives an asserted signal. In response, the set/reset latch 165 deasserts the output value (Q) on connection 177 once the clock signal on connection 65 toggles at the end of the clock cycle.

If, on the other hand, the inverse of the predicate bit is deasserted, then the foregoing AND gate 185 produces a deasserted output, and the switching element 75 coupled to the AND gate 185 is deactivated. Assuming that no other AND gate 185 produces an asserted output, the voltage of connection 184 remains at $V_{dd}$. Therefore, the reset port 174 receives a deasserted signal, and the output value (Q) on connection 177 is unaffected by the output of the foregoing AND gate 185.

Due to the foregoing, the predicate value produced by the aforementioned instruction updates the predicate register 160 identified by the register identifier associated with the predicate bit whether the predicate bit is asserted or deasserted.

It should be noted that if the aforementioned instruction is invalid, then the pipeline 21 transmits a deasserted valid bit rather than an asserted valid bit. As a result, none of the predicate registers 160 in the predicate register file 152 are updated in response to the predicate bit produced by the instruction.

It should also be noted that in some embodiments, it is not necessary for the predicate register 160 to receive a valid bit. For example, in an alternative environment, the write port 31 may be configured to determine whether the register identifier received by the write port 31 has been produced by an invalid instruction. If so, the write port 31 can be configured to deassert each decode bit transmitted by the write port 31 in response to the foregoing register identifier. As a result, none of the predicate registers 160 should be updated in response to data produced by the invalid instruction. In another embodiment where set and reset signals are used to update the predicate register file 152, the pipeline 21 producing a set and reset signal in response to an invalid instruction could be designed to refrain from asserting both the set and reset signals based on a determination that the instruction is invalid. Other embodiments may be employed to prevent predicate data from invalid instructions from updating the predicate register file 152.

It should also be noted that the circuitry in FIG. 7 used to properly assert and deassert the signals transmitted to the set port 172 and/or reset port 174 of the latch 165 and the circuitry in FIG. 8 used to implement the latch 165 are shown for illustrative purposes only. The foregoing circuitry may be modified and/or replaced with other circuitry without departing from the principles of the present invention. However, the configuration of the set/reset latch 165 should be such that an enable signal is not necessary for proper operation.

Furthermore, the present invention has been described herein as writing a bit of predicate data to a register 160, but the present invention may be used to similarly write other types of data to register 160. The present invention is particularly useful in applications that write only a single bit of data to each register within a register file.

It should be emphasized that the above-described embodiments of the present invention, particularly, any "preferred"

embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of the present invention and protected by the claims.

Now, therefore, the following is claimed:

1. A system for writing data, comprising:
a plurality of registers, each of said registers having a set/reset latch and configured to receive a first signal and a second signal, said each register configured to set said set/reset latch in response to said first signal when said first signal exhibits a first logical state and said second signal is asserted, said each register further configured to reset said set/reset latch when said first signal exhibits a second logical state and said second signal is asserted; and
a write port coupled to each of said registers, said write port configured to receive a register identifier identifying one of said registers and to receive said first signal, said write port configured to transmit said first and second signals to each of said registers, said write port further configured to assert said second signal transmitted to said one register and to deassert said second signal transmitted to the other of said registers in response to said register identifier.

2. The system of claim 1, wherein said each register is configured to reset said set/reset latch in response to said first signal when said first signals exhibits said second logical state and said second signal is asserted.

3. The system of claim 1, wherein said each register is further configured to receive a third signal transmitted from said write port, said each register configured to reset said set/reset latch in response to said third signal.

4. The system of claim 1, wherein said first signal is indicative of a predicate bit.

5. The system of claim 1, wherein said each register is further configured to ignore said first signal transmitted from said write port to said each register when said second signal transmitted from said write port to said each register is deasserted.

6. The system of claim 1, wherein:
said write port is further configured to receive a third signal and to transmit said third signal to each of said registers along with said first and second signals, said third signal asserted when an instruction associated with said first signal is valid and said third signal deasserted when said instruction is invalid; and
each of said registers is further configured to receive said third signal and to only set said set/reset latch in response to said first and second signals when said third signal is asserted and to only reset said set/reset latch in response to said second signal when said third signal is asserted.

7. The system of claim 1, further comprising:
a first connection coupled to a set port of said set/reset latch;
a first logical gate having an output connection, said first logical gate configured to receive said first and second signals transmitted to said each register and to transmit an asserted signal across said output connection of said first logical gate when said first signal exhibits said first logical state and said second signal is asserted; and a first switching element coupled to said first connection and to said output connection of said first logical gate, wherein a state of said first switching element is controlled via said signal transmitted across said output connection of said first logical gate.

8. The system of claim 7, further comprising:
a second connection coupled to a reset port of said set/reset latch;
a second logical gate having an output connection, said second logical gate configured to receive said second signal transmitted to said each register and an inverse of said first signal transmitted to said each register and to transmit an asserted signal across said output connection of said second logical gate when said second signal is asserted and said first signal exhibits said second logical state; and
a second switching element coupled to said second connection and to said output connection of said second logical gate, wherein a state of said second switching element is controlled via said signal transmitted across said output connection of said second logical gate.

9. The system of claim 7, wherein said first connection is coupled to said set port via a first inverter and said second connection is coupled to said reset port via a second inverter.

10. The system of claim 9, wherein said first and second logical gates are both AND gates.

11. A system for writing data, comprising:
a plurality of registers, each of said registers having a set/reset latch;
means for receiving a first signal and a register identifier identifying one of said registers;
means for transmitting said first signal and a second signal to each of said registers; and
means for asserting said second signal transmitted to said one register and for deasserting said second signal transmitted to each of the other registers in response to said register identifier,
wherein said one register includes:
means for setting the set/reset latch of said one register based on said asserted second signal if said first signal received by said one register exhibits a first logical state; and
means for resetting said set/reset latch of said one register based on said asserted second signal when said first signal received by said one register exhibits a second logical state.

12. The system of claim 11, wherein said set/reset latch is indicative of a predicate status of an instruction.

13. The system of claim 11, wherein said setting means and said resetting means each includes a means for ignoring said first signal received by said one register when said second signal received by said one register is deasserted.

14. The system of claim 11, wherein:
said receiving means includes a means for receiving a third signal, said third signal asserted if an instruction associated with said first signal is valid and deasserted if said instruction is invalid; and
said setting means is configured to set said set/reset latch of said one register in response to said first and second signals only when said third signal is asserted.

15. The system of claim 14, wherein said setting means further comprises:
a first connection coupled to a set port of said set/reset latch of said one register;
a first logical gate having an output connection, said first logical gate configured to receive said first and second signals transmitted to said one register and to transmit an asserted signal across said output connection of said first logical gate when said first signal exhibits said first logical state and said second signal is asserted; and a first switching element coupled to said first connection and to said output connection of said first logical gate, wherein a state of said first switching element is controlled via said signal transmitted across said output connection of said first logical gate.

16. The system of claim 15, wherein said resetting means further comprises:

a second connection coupled to a reset port of said set/reset latch of said one register;

a second logical gate having an output connection, said second logical gate configured to receive said second signal transmitted to said one register and an inverse of said first signal transmitted to said one register and to transmit an asserted signal across said output connection of said second logical gate when said second signal is asserted and said first signal exhibits said second logical state; and a second switching element coupled to said second connection and to said output connection of said second logical gate, wherein a state of said second switching element is controlled via said signal transmitted across said output connection of said second logical gate.

17. A method for writing data, comprising the steps of:

providing a plurality of registers, each of said registers having a set/reset latch;

receiving a first signal and a register identifier identifying one of said registers;

transmitting said first signal and a second signal to each of said registers;

asserting said second signal transmitted to said one register in response to said register identifier;

deasserting said second signal transmitted to each of the other registers in response to said register identifier;

setting the set/reset latch of said one register based on said asserted second signal if said first signal received by said one register exhibits a first logical state; and resetting said set/reset latch of said one register based on said asserted second signal bit when said first signal received by said one register exhibits a second logical state.

18. The method of claim 17, further comprising the step of:

indicating via said set/reset latch whether an instruction is predicate enabled.

19. The method of claim 17, further comprising the step of:

ignoring said first signal transmitted to said other registers based on said deasserted second signal.

20. The method of claim 17, further comprising the steps of:

receiving a third signal;

asserting said third signal if an instruction associated with said first signal is valid;

deasserting said third signal if an instruction associated with said first signal is invalid; and performing one of said setting and resetting steps based on said third signal.

* * * * *